(12) United States Patent
Chakravorty et al.

(10) Patent No.: US 6,477,034 B1
(45) Date of Patent: Nov. 5, 2002

(54) INTERPOSER SUBSTRATE WITH LOW INDUCTANCE CAPACITIVE PATHS

(75) Inventors: Kishore K. Chakravorty, San Jose, CA (US); Michael Walk, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/970,422

(22) Filed: Oct. 3, 2001

(51) Int. Cl.[7] .............................................. H01G 4/228
(52) U.S. Cl. .................. 361/306.3; 361/763; 361/306.1
(58) Field of Search ........................ 361/301.3, 301.4, 361/303, 306.1, 306.3, 309, 311, 312, 761, 763, 807, 809–811

(56) References Cited

U.S. PATENT DOCUMENTS 5,774,326 A * 6/1998 McConnelee et al.
5,786,238 A * 7/1998 Pai et al.
6,034,332 A   3/2000 Moresco et al. ............ 174/255
6,102,710 A   8/2000 Beilin et al. .................. 439/67
6,184,476 B1 * 2/2001 Takahashi et al.
6,195,249 B1 * 2/2001 Honda et al.

* cited by examiner

Primary Examiner—Anthony Dinkins
(74) Attorney, Agent, or Firm—Schwegman, Lundberg, Woessner & Kluth, P.A.

(57) ABSTRACT

A thin film capacitor provides an interposer substrate between an integrated circuit die and an organic substrate. The interposer substrate includes a first conductive layer deposited on a base substrate layer. A portion of the first conductive layer provides a first electrode region serving as a first plate of the capacitor. Portions of a second conductive layer forming a second electrode region serving as a second plate of the capacitor. A dielectric layer is disposed between the first and second conductive layers to provide for capacitive regions between the first electrode region and the second electrode region. The base substrate layer and die may be based on similar semiconductor materials, such as Silicon or Gallium Arsenide, to provide an improved coefficient of thermal expansion match.

21 Claims, 6 Drawing Sheets

INTERPOSER SUBSTRATE WITH LOW INDUCTANCE CAPACITIVE PATHS

FIELD OF THE INVENTION

The present invention pertains to integrated circuit device packaging, and in particular, to interposer substrates for mounting integrated circuit die, and more particularly to interposer substrates that provide capacitance and methods of making the same.

BACKGROUND OF THE INVENTION

It is desirable to provide decoupling capacitance in close proximity to integrated circuit (IC) die, and the need for such capacitance increases as the switching speed and current requirements of the devices becomes higher. For example, current microprocessor die have switching speeds that exceed 1 GHz and have high current demand. To help provide this needed capacitance, discrete capacitors have been mounted as separate components on the surface of the substrate next to the IC die. However, this arrangement uses up valuable "real estate" on the surface of the substrate and suffers from the fact that such discrete capacitors are not as close to the IC die as needed resulting in unacceptable inductance. In some designs, decoupling capacitance is incorporated into multilayered substrates by forming capacitor plates within the substrate. This technique adds complexity to the multilayered substrate, reducing the manufacturing yield. In such designs, the capacitor structure is one of the most likely components to be defective due to the relatively close spacing of the plates and the possibility of pin-hole defects or other causes of electrical shorting or leakage in the thin dielectric layer between the plates. If a defective capacitor is incorporated into a substrate, such as a multichip module (MCM) substrate, and the defect is not discovered until fabrication of the substrate is complete, the resulting loss may be quite significant.

Another problem with traditional approaches to packaging IC die is the method used for delivering power to the die. Power lines are generally routed through the same substrate utilized to carry signals to and from the die. Equally important is the fact that the thinness of the substrates results in power feeds to the IC die that have relatively high impedance. This high impedance results in undesired noise, power loss and excess thermal energy production. These same problems are applicable to routing power and signal lines though an interposer substrate. Such interposer substrates are mounted on a base substrate, with the IC die being mounted on the interposer substrates.

Thus, there is general need for apparatus that reduce the inductance and improve the capacitance on power supply lines for IC die. There is also a general need for a decoupling capacitor that may be used as an interposer substrate between a die and an organic substrate. Thus, there is also a need for a high-performance decoupling array capacitor structure that may be used as an interposer substrate between a die and an organic substrate. Thus, there is also a need for an interposer substrate that reduces a coefficient of thermal expansion mismatch between a die and an organic substrate. Thus, there is also a need for an interposer substrate that provides reduced inductance and improved capacitance between a die and an organic substrate. Thus, there is also a general need for delivering power to a die with reduced inductance.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

Figure 1:
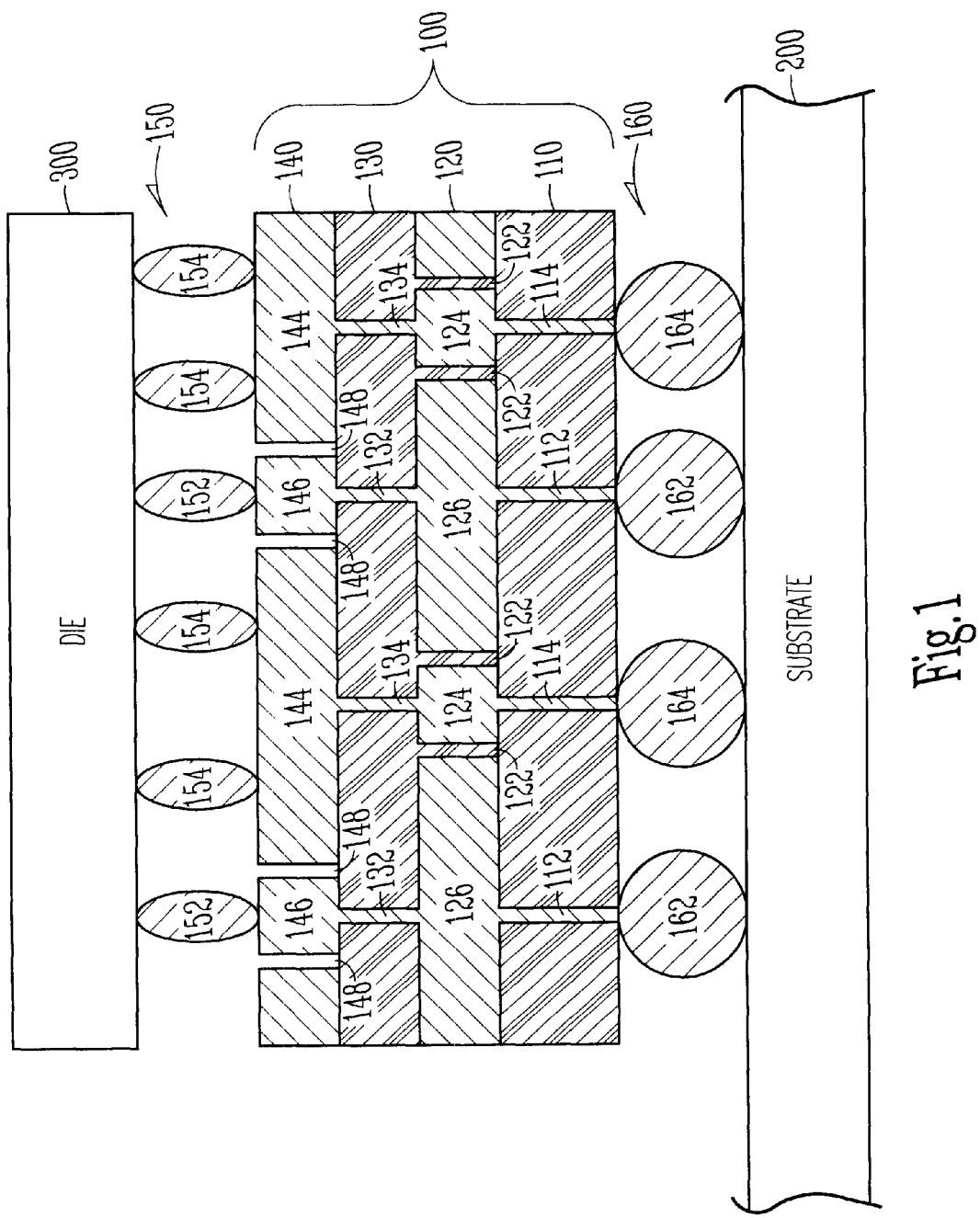
FIG. 1 illustrates a cross sectional view of a capacitive region of an interposer substrate mounted between a die and a base substrate in accordance with an embodiment of the present invention.

The description set out herein illustrates the various embodiments of the invention and such description is not intended to be construed as limiting in any manner.

DETAILED DESCRIPTION

The present invention provides an interposer substrate for mounting integrated circuit die and method for making an interposer substrate. In one of the various embodiments, the interposer substrate may mount between a die and an organic substrate while providing capacitance and reduced inductance on power supply lines. The present invention, in one of the embodiments, also provides a decoupling capacitor that may be used as an interposer substrate between a die and an organic substrate. The present invention, in another of the embodiments, provides a high-performance decoupling array capacitor structure that may be used as an interposer substrate between a die and an organic substrate. The present invention, in another of the embodiments, provides an interposer substrate that reduces a coefficient of thermal expansion mismatch between a die and an organic substrate.

In accordance with the embodiments of the present invention, decoupling capacitance is provided extremely close to the IC die reducing the requirements of external decoupling capacitors or decoupling capacitors embedded in a base substrate. In the case of multichip modules (MCM), for example, this increases the modularity of an overall MCM resulting in improving overall system yields and reducing manufacturing costs. The interposer substrate of the present invention can be separately manufactured and tested before incorporation onto a substrate or incorporation into a MCM.

The present invention also provides a capacitor having two conductive paths thus providing capacitance between the conductive paths. In another embodiment, the present invention provides a multilayer capacitor having two conductive paths and providing capacitance between the conductive paths. In accordance with these embodiments, the conductive paths may serve as the power supply paths for the IC die. The conductive paths may be substantially isolated from input/output signal paths.

The present invention is directed to an interposer substrate for mounting die to a substrate, and is particularly useful for mounting an IC die to a MCM substrate. Although the present invention is described in the context of an interposer used to mount a single die onto a substrate, those skilled in the art will recognize that the interposer substrate of the present invention could also be used to mount more than one die onto a substrate. Likewise, although the present invention is described in the context of mounting an IC die onto a multichip module substrate, those skilled in the art will recognize that the present invention could be used in connection with other types of electronic devices and other types of substrates. The interposer substrate of the present invention also helps accommodate differences in the thermal expansion coefficients between the base substrate and the IC die.

FIG. 1 illustrates a cross sectional view of a capacitive region of an interposer substrate mounted between a die and base substrate in accordance with an embodiment of the present invention. Interposer substrate 100 couples between die 300 and substrate 200 respectively with conductive bump layer 160 and conductive bump layer 150. Die 300 may be any integrated circuit die and including a processor die. Base substrate 200 may be an integrated circuit board and may be comprised of an organic substrate material such as Duroid, however, this is not a requirement. Organic substrates also may include flexible and rigid organic circuit boards or modules including circuit boards formed of a laminate material such as FR4, FR5, BT (bismaleid triazine) resin, etc. and include high density interconnect (HDI) organic substrates. Such substrates, for example, may be coreless or may have a woven or reinforced core. Packaging technologies such as Organic Land Grid Array Packages (OLGA), CQFP, CBGA, CCGA, FCPGA, CPGA, TBGA, PEGA, DCAM, MCM-L, etc. are also suitable.

Interposer substrate 100 comprises base substrate layer 110, first conductive layer 120 disposed on substrate layer 110, second conductive layer 140 and dielectric layer 130 between first conductive layer 120 and second conductive layer 140. Base substrate layer 110 is a non-conductive substrate material and is desirably a silicon-based substrate. Base substrate layer 110 has first and second thru-vias 112 and 114 therethrough. Die 300 may be a silicon-based die to provide improved coefficient of thermal expansion (CTE) match with interposer substrate 100. Although the interposer substrate of the present invention is described herein as coupling between a single die and an a substrate, the interposer substrate of the present invention is equally applicable to multichip modules and may be used to couple several die to a substrate. In one embodiment, base substrate layer 110 and die 300 are based on similar semiconductor materials to provide an improved coefficient of thermal expansion match. Examples of suitable semiconductor material include such semiconductor materials as Silicon or Gallium Arsenide (GaAs).

This invention also has application in situations wherein electrical and mechanical interconnection utilize solder bumps between the components with dissimilar coefficient of thermal expansions. Alternative applications include ceramic substrate to organic laminate printed wiring board, chip to organic laminate printed wiring board (typically referred to as chip-on-board), chip to flexcircuit (typically referred to as chip-on-flex), organic printed wiring board to organic printed wiring board wherein the two printed wiring boards are constructed of dissimilar materials.

First conductive layer 120 is comprised of first electrode region 126 and first conductive portions 124. In accordance with one embodiment, conductive portions 124 and first electrode region 126 are disposed in an alternating pattern as illustrated. In accordance with this embodiment, first conductive layer 120 is primarily comprised of conductive material comprising first electrode region 126. First conductive portions 124 are electrically isolated from first electrode region 126 by spaces 122 in first conductive layer 120. In accordance with one embodiment, first electrode region 126 makes up a first plate of a capacitor. The different portions of first electrode region 126, illustrated in FIG. 1, are coupled together forming first conductive layer 120, which provide a capacitor's first plate. In this embodiment, each first conductive portion 124 is a small portion of first conductive layer 120 and is electrically isolated from other conductive portions 124. Each first conductive portion 124 is coupled electrically to the other first conductive portions 124 through interposer substrate 100 as discussed below. Base substrate layer 110 has first thru-vias 112 coupling first electrode region 126 with conductive bumps 162, and second thru-vias 114 coupling first conductive portions 124 with conductive bumps 164. Prior to or during the fabrication of first conductive layer 120, metallization of first and second thru-vias 112 and 114 in substrate layer 110 may be provided.

Dielectric layer 130 is desirably a thin-film dielectric layer deposited over first conductive layer 120. Dielectric layer 130 may be selected from a group consisting of tantalum Penta Oxide ($Ta_2O_5$), oxynitride film (SiONx film), Barium Titanate ($Sr/BaTiO_3$), and Barium Strontium Titanate (BST), although other dielectric materials may also be suitable. In one embodiment, dielectric layer 130 is sputter deposited while in other embodiments of the present invention (e.g., when Tantalum Penta Oxide is used for dielectric layer 130), dielectric layer 130 may be anodically grown. In another embodiment of the present invention, dielectric layer 130 may be deposited by a chemical vapor deposition (CVD) process. The process for forming dielectric layer 130 is generally dependent on the dielectric material selected.

First conductive layer spaces 122 may be filled with dielectric material during the process of forming dielectric layer 130. Dielectric layer 130 includes dielectric layer vias 132 and 134 which go through the dielectric layer. In accordance with an embodiment of the present invention, dielectric layer 130 has a thickness that ranges between 200 and 3000 Angstroms, however, dielectric layers that are thinner or thicker are equally suitable for use with embodiments of the present invention.

Interposer substrate 100 also includes second conductive layer 140. Second conductive layer 140 has second electrode region 144 and second conductive portions 146. As part of forming second conductive layer 140, dielectric layer first and second vias 132, 134 may be metallized, forming electrical connections with respectively with first electrode region 126 and first conductive portions 124.

Second conductive portions 146 are electrically isolated from second electrode region 144 by spaces 148 in second conductive layer 140. In accordance with one embodiment of the present invention, second electrode region 144 serves as a second plate of a capacitor and second conductive layer 140 is primarily comprised of second electrode region 144. Second conductive portions 146, remain electrically isolated from each other as part of second conductive layer 140, but are electrically coupled to each other by dielectric layer first vias 132 which are electrically coupled to first electrode region 126. In the same way, first conductive portions 124 which are electrically isolated as part of first conductive layer 120, are coupled together with dielectric layer second vias 134 which are electrically coupled to second electrode region 144.

At least two conductive paths are provided through interposer substrate 100. A first conductive path comprises first thru-vias 112, first electrode region 126, dielectric layer first vias 132, and second conductive portions 146. A second conductive path comprises second thru-vias 114, first conductive portions 124, dielectric layer second vias 134, and second electrode region 144. Through these electrically conductive paths, power may be provided to die 300 from substrate 200 through, for example, the use of conductive bump layers 150, 160. Conductive bump layers 150, 160 respectively comprise conductive bumps 152 and 162 which provide for current through the first conductive path, and conductive bumps 154 and 164 which provide for current through the second conductive path. A large number of these conductive paths provide for reduced inductance which is especially beneficial when the paths are used for power supply lines for a die. In accordance with one embodiment of the present invention, a grid pattern is provided by alternating each of the conductive paths through interposer substrate 100. The alternating of the opposite direction current paths result in a further reduction of inductance between die 300 and substrate 200 due to the cancellation of inductance resulting from the mutual coupling of the opposite flowing current. In addition to improved inductance, first electrode region 126 and second electrode region 144 provide for the plates of a parallel plate type capacitor with dielectric layer 130 in-between the plates. In the embodiment shown, capacitances of up to one microfarad and greater are possible. Accordingly, external capacitors may no longer be needed on, for example, the power supply lines of die 300.

Figure 2:
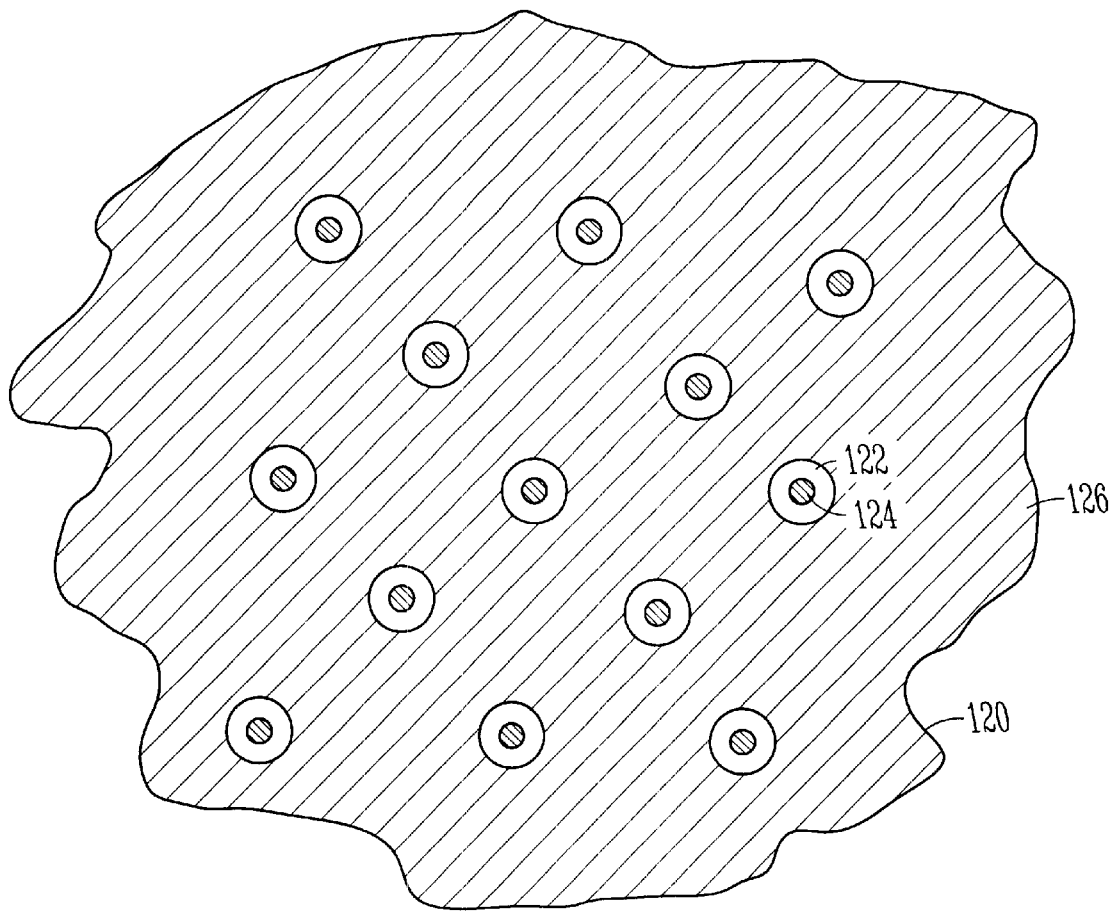
FIG. 2 illustrates a top view of a portion of a conductive layer of a capacitive region of an interposer substrate in accordance with an embodiment of the present invention.

FIG. 2 illustrates a top view of a portion of a capacitive region of a conductive layer of an interposer substrate in accordance with an embodiment of the present invention. In the capacitive region, first conductive layer 120 of interposer substrate 100 (FIG. 1) is substantially comprised of conductive material that makes up first electrode region 126 with substantially smaller portions comprising first conductive portions 124. First electrode region 126 is electrically isolated from each of the first conductive portions 124 by spaces 122. Although not illustrated in FIG. 1, second conductive layer 140 of interpose substrate 100 (FIG. 1) is similarly configured with second electrode region 144 comprises a substantial portion of second conductive layer 140 and with substantially smaller portions comprising second conductive portions 146.

Figure 3:
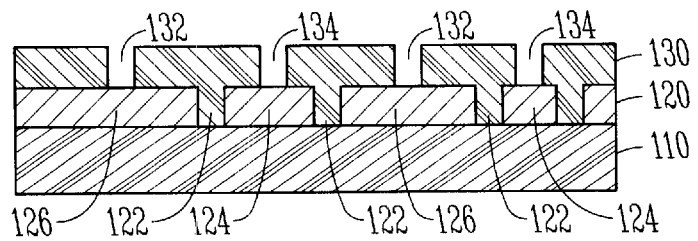
FIGS. 3–5 illustrate an interposer substrate in accordance with an embodiment of the present invention during various steps of fabrication.
Figure 4:
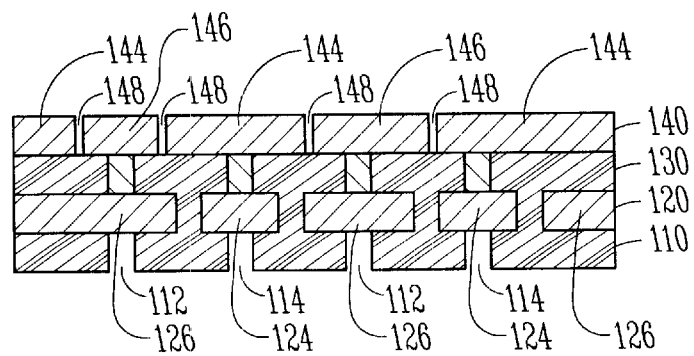
Figure 5:
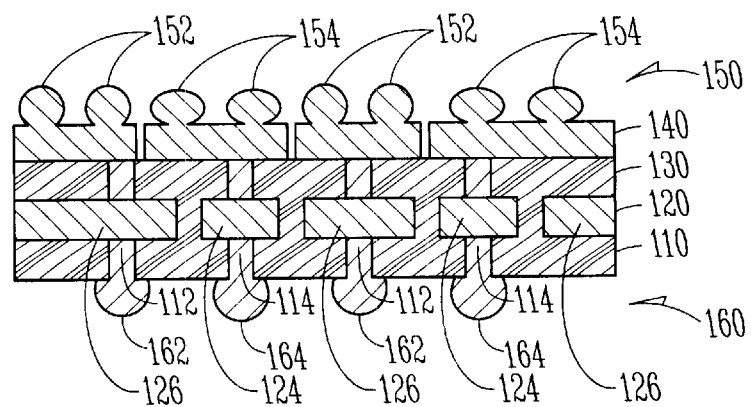
Figure 6:
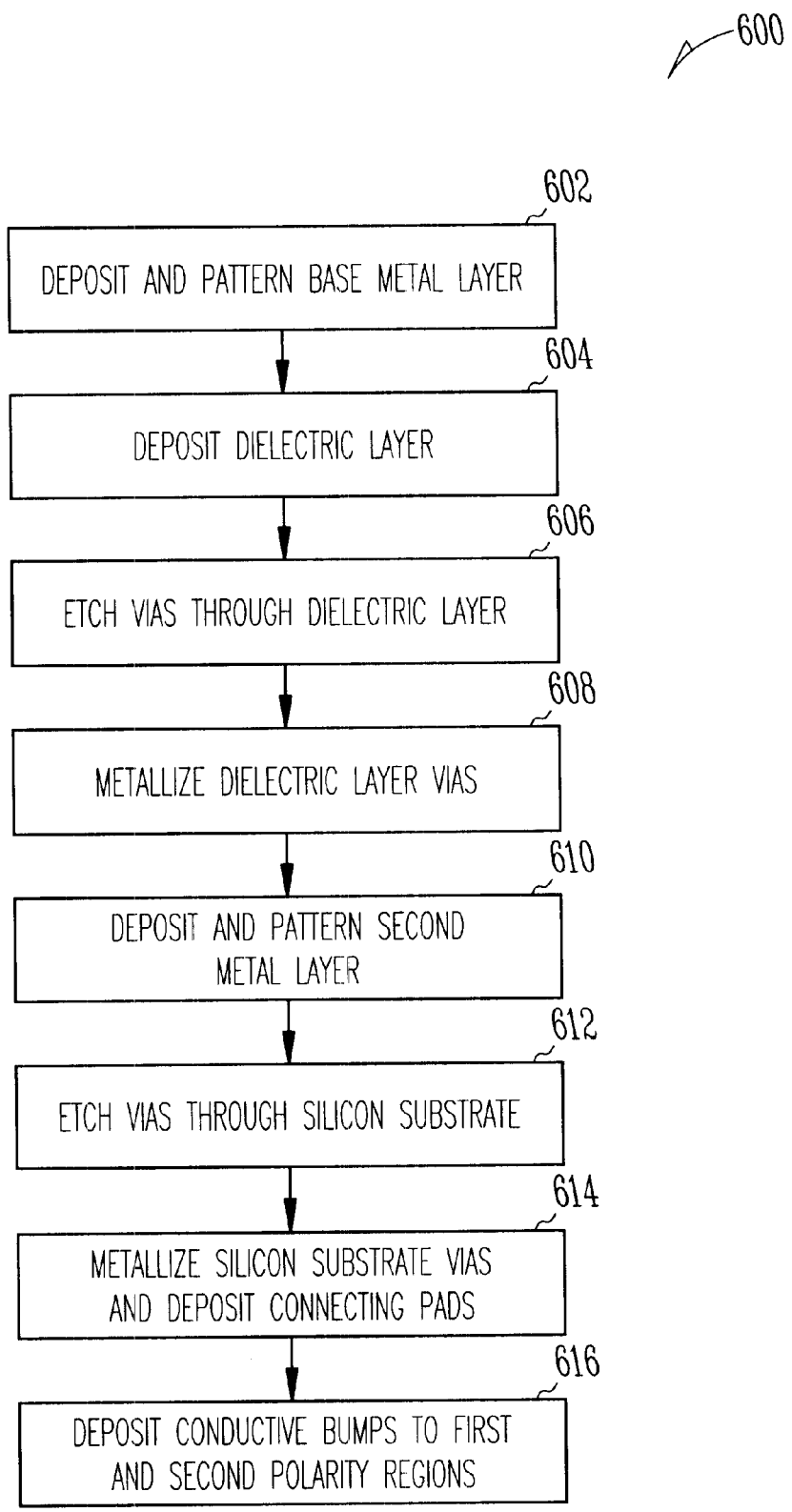
FIG. 6 is a simplified flow chart of a procedure for fabricating an interposer substrate in accordance with an embodiment of the present invention.

FIGS. 3–5 illustrate an interposer substrate in accordance with an embodiment of the present invention during various steps of fabrication. FIG. 6 illustrates a simplified flowchart of a procedure for fabricating an interposer substrate in accordance with an embodiment of the present invention. Procedure 600 may be used to fabricate interposer substrate 100 (FIG. 1), although it should be understood that other processes may also be used to fabricate interposer substrates of the various embodiments of the present invention. Although for ease of understanding, procedure 600 is described for fabricating the example embodiment of interposer substrate 100 (FIG. 1), it should be understood that procedure 600 may also be used to fabricate other embodiments of interposer substrates in accordance the present invention.

In block 602, a base metal layer is deposited and patterned on a base substrate layer. As shown in FIG. 3, first conductive layer 120 is deposited on substrate layer 110 providing a pattern with spaces 122 between first conductive regions 124 and first electrode regions 126. Base substrate 110 may be a silicon-based substrate, such as a silicon wafer, with a thickness between 200 and 500 microns although different thickness substrates are equally suitable to the present invention.

In block 604, a dielectric layer is deposited over the first conductive layer. As shown in FIG. 2, dielectric layer 130 is deposited over first conductive layer 120. The dielectric layer may include anodically grown or sputter deposited $Ta_2O_5$. In other embodiments of the present invention, dielectric layer 130 may include Oxynitride film, Barium Titanate or Barium Strontium Titanate which is either deposited by chemical vapor deposition or sputter deposited. Other materials are also suitable for use with the various embodiments of the present invention. Solution techniques such as sol-gel may also be used to deposit the dielectric layer. Desirably, dielectric layer 130 is a thin film dielectric layer having a thickness between 300 and 600 Angstroms, although other thicknesses in the range of 200 to 3000 Angstroms are equally suitable. Greater thicknesses provide for reduced capacitance and increased inductance and, accordingly, it is desirable to provide a thin dielectric layer.

In block 606, vias are fabricated in the dielectric layer. For example, dielectric layer first and second vias 132 and 134 may be fabricated in dielectric layer 130. Dielectric layer first and second vias 132 and 134 may be etched in dielectric layer 130 using a reactive ion etching (RIE) process although other plasma techniques are also suitable. Dielectric layer first and second vias 132, 134 may be formed by a standard plasma etch technique to couple with first conductive layer 120. Laser-based techniques for etching dielectric layer first and second vias 132 and 134 may also be used.

In block 608, dielectric layer first and second vias 132 and 134 are metallized so that conductive paths are provided respectively by dielectric layer first and second vias 132 and 134 to first electrode region 126 and first conductive portions 124 of first conductive layer 120. Dielectric layer first and second vias 132, 134 may be filled with conductive paste or metallized with an electroless or electroplating process to provide the conductive paths through dielectric layer 130.

In block 610, a second conductive layer is deposited and patterned on the dielectric layer. Referring to FIG. 4, second conductive layer 140 is deposited on dielectric layer 130. This task of depositing second conductive layer 140 may be part of metallizing dielectric layer first and second vias 132 and 134. Spaces 148 are formed in the pattern of second conductive layer 140 to electrically isolate second electrode region 144 from second conductive portions 146. In this way, the first and second plates of the capacitor formed within interposer substrate 100 are not shorted out.

In block 612, thru-vias are formed or etched in the base substrate layer. Referring to FIG. 4, first and second thru-vias 112 and 114 are formed through base substrate 110 to connect with first conductive layer 120. First and second thru-vias 112 and 114 may be formed using an atmospheric downstream plasma etch process although other methods of forming vias in substrates may be equally suitable. Some thinning of base substrate 110 may be part of this process. For example, when first and second thru-vias are created using a RIE plasma process or a laser process, thinning of base substrate layer 110 may occur.

In block 614, the thru-vias in the base substrate layer are metallized and conductive terminal pads are deposited.

Referring to FIG. 5, first and second thru-vias 112 and 114 may be metallized by sputter depositing, or using an electroless or electroplating process. Alternatively, first and second thru-vias 112 and 114 may be filled with a conductive metal filled polymer paste. As part of block 614, connecting pads are deposited on either side or adjacent to first and second thru-vias 112 and 114. The terminal pads may suitable for the deposit of conductive bumps.

In block 616, conductive bumps are deposited on the first and second polarity regions. Referring to FIG. 5, conductive bump layer 160 is formed on base substrate layer 110 and conductive bump layer 150 is formed on second conductive layer 140. Conductive bumps 162 are provided at first thru-vias 112 and conductive bumps 164 are provided at second thru-vias 114. Conductive bumps 152 are provided to couple to with second conductive portions 146, and conductive bumps 154 are provided to couple with second electrode region 144. In one embodiment, the terminal pads may take the form of conductive bumps 162, 164 illustrated in FIG. 5. Terminal pads may also be provided in the form of conductive bumps 152, 154 on second conductive layer 140. Conductive bump layers 150 and 160 may be formed by solder or be formed with another conductive material such as a copper-based material. Any established wafer bumping technology may also be used. Preferably, conductive bumps 152, 154, 162, 164 are grown over terminal pads. Conductive bumps 152 and 162 provide part of a first conductive path through interposer substrate 100 and couple with a first plate of capacitor formed by first electrode region 126. Conductive bumps 154 and 164 provide part of a second conductive path through interposer substrate 100 and couple with a second plate of capacitor formed by second electrode region 144.

Upon completion of procedure 600, an interposer substrate such as interposer substrate 100 (FIG. 1) is fabricated that provides a single layer capacitor as described above. Procedure 600, however, may be extended to build a multi-layer capacitor as part of an interposer substrate. For example, alternating layers of conducting electrode material and dielectric layers may be applied. Electrode layers of the same polarity are electrically connected together as discussed above.

Figure 7:
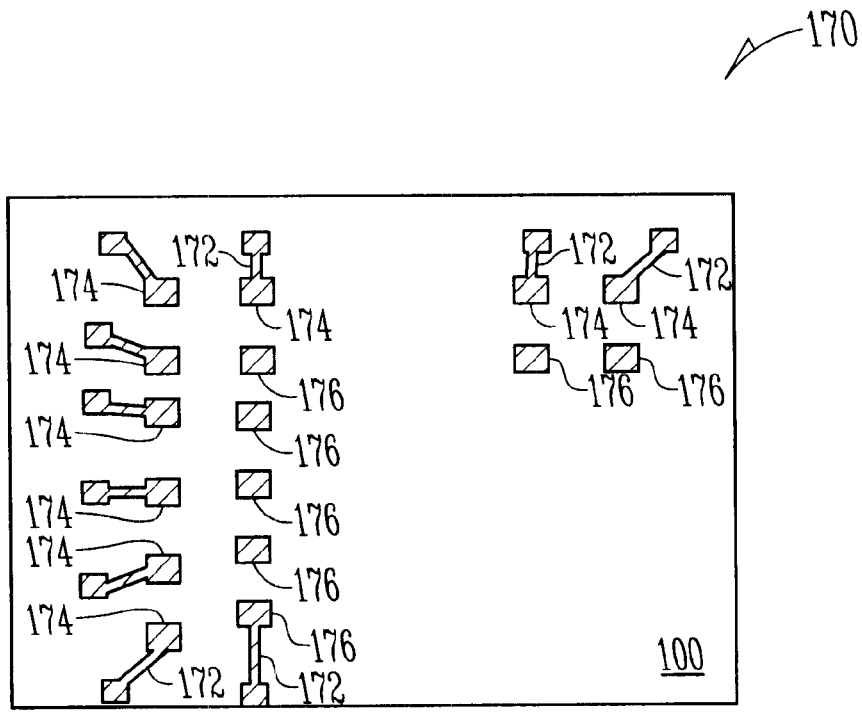
FIG. 7 illustrates a top view of an interposer substrate in accordance with an embodiment of the present invention.
Figure 8:
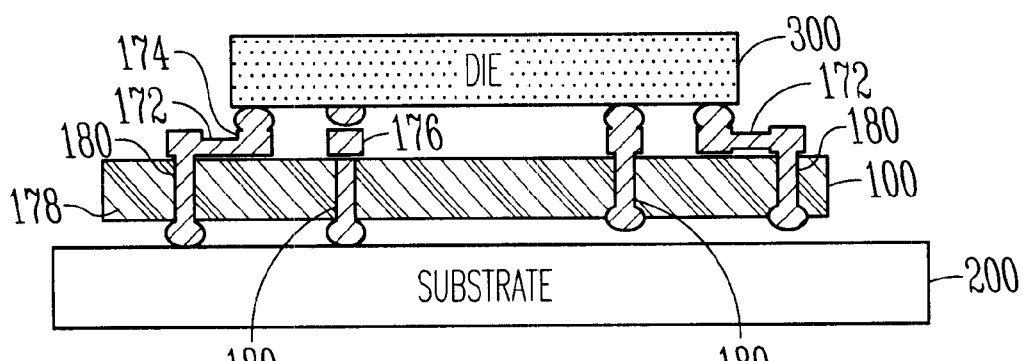
FIG. 8 illustrates a side view of the embodiment of the interposer substrate illustrated in FIG. 7.

FIG. 7 illustrates a top view of an interposer substrate in accordance with an embodiment of the present invention. FIG. 8 illustrates a side view of the embodiment of the interposer substrate illustrated in FIG. 7. The embodiment of interposer substrate 100 illustrated in FIG. 7 provides for rerouting of input/output (I/O) pads to larger pitches using I/O re-routing traces 172. I/O re-routing traces 172 are short metal traces that allow for a larger pitch on a substrate such as substrate 200 (FIG. 8). Examples of conductive materials that may be used for traces 172 include copper and aluminum. In addition to the conductive paths through interposer substrate 100 that provide for power supply paths such as Vcc or Vss, interposer substrate provides thru-paths for the input and output signals of a die such as die 300. These input and output thru-paths provide a conductive signal path through each layer of the interposer substrate. For example, referring to FIG. 8, I/O thru-vias 180 provide a conductive path through base substrate layer 110, first conductive layer 120, dielectric layer 130 and second conductive layer 140. I/O thru-vias 180 are electrically isolated from conductive layers 120 and 140. I/O thru-vias 180 and I/O rerouting traces 172 may be included as part of the embodiments illustrated in FIGS. 1 through 5, but are not illustrated for simplicity purposes. FIG. 7 also illustrates internal terminal pads 176 which are not re-routed to a larger pitch. The power supply paths may be substantially isolated from the I/O signal paths.

Capacitive region 178 (FIG. 8) is a region of an interposer substrate that provides capacitance and improved inductance performance for an interposer substrate, such as the various embodiments of interposer substrate 100 illustrated in FIGS. 1 through 5. Capacitive region 178, for example, may be the region of interposer substrate 100 illustrated in FIG. 1.

Figure 9:
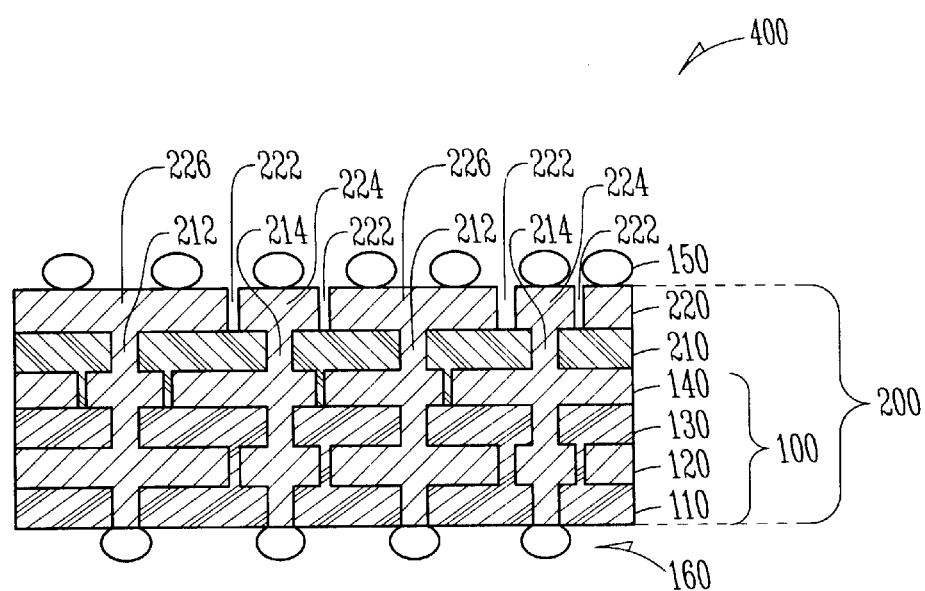
FIG. 9 illustrates an interposer substrate including a multilayer capacitor in accordance with an embodiment of the present invention.

FIG. 9 illustrates an interposer substrate including a multi-layer capacitor in accordance with an embodiment of the present invention. In addition to base substrate layer 110, first conductive layer 120, dielectric layer 130 and second conductive layer 140, interposer substrate 400 includes second dielectric layer 210 and third conductive layer 220. Second dielectric layer 210 is similar to first dielectric layer 130 and includes dielectric layer vias 212 and 214 which are metallized to provide electrical connections with the portions of second conductive layer 140. Third conductive layer 220 includes third electrode region 226 and third conductive portions 224. Third conductive layer 220 is primarily made up of third electrode region 226 which is isolated from the third conductive portions 224 by spaces 222 in third conductive layer 220. Third electrode region 226 provides a third plate of a multi-layer capacitor provided by interposer substrate 400. A capacitance results from dielectric layer 210 being between second electrode region 144 and third electrode region 226. Third conductive portions 224 are individually coupled electrically by second dielectric layer fourth vias 214 to second electrode region 144. Third electrode region 226 is coupled electrically by second dielectric layer third vias 212 to each of second conductive portions 146. Accordingly, conductive paths are provided through interposer substrate 400 which may be used, for example, providing power supply voltages to a die.

Figure 10:
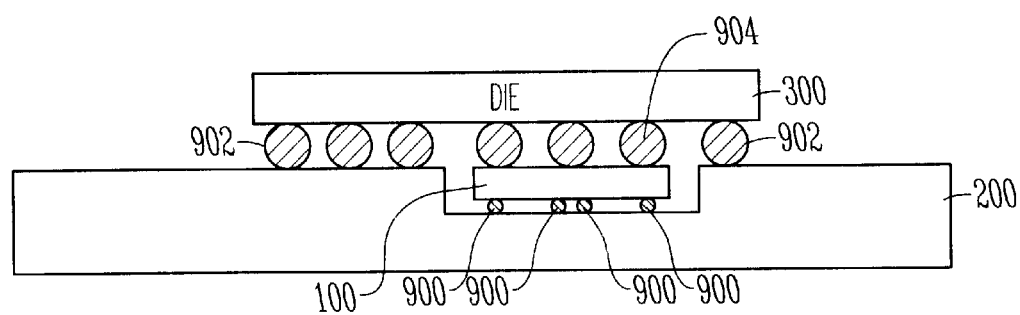
FIG. 10 illustrates interposer substrate embedded in a base substrate in accordance with an embodiment of the present invention.

FIG. 10 illustrates an interposer substrate embedded in a base substrate in accordance with an embodiment of the present invention. In the embodiment shown in FIG. 10, interposer substrate 100 is illustrated as being much smaller than die 300. In this embodiment, interposer substrate 100 may primarily provide for the power supply voltages for die 300 while I/O paths may be routed directly between die 300 and substrate 400. For example, conductive bumps 902 may provide signal I/O paths while conductive bumps 904 provide for the power supply paths. Conductive bumps 906 provide the power supply paths between base substrate 200 and interposer substrate 100. In accordance with the embodiment illustrated in FIG. 10, interposer substrate 100 may provide a single layer capacitor as illustrated in FIG. 1, or may provide a multi-layer capacitor as illustrated in FIG. 9.

Thus, improved interposer substrates for mounting integrated circuit die and a method for making an interposer substrate has been described. In one of the various embodiments, the interposer substrate may mount between a die and an organic substrate while providing capacitance and reduced inductance on power supply lines. A decoupling capacitor has also been described that may be used as an interposer substrate between a die and an organic substrate. A high-performance decoupling array capacitor structure that may be used as an interposer substrate between a die and an organic substrate has also been described. The interposer substrate of the present invention reduces a coefficient of thermal expansion mismatch between a die and an organic substrate, and provides reduced inductance between the die and the organic substrate.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An interposer substrate for mounting a die to a circuit board comprising:
   a first conductive layer disposed on a substrate layer, a portion of the first conductive layer providing a first electrode region;
   a second conductive layer, a portion of the second conductive layer providing a second electrode region; and
   a dielectric layer disposed between the first and second conductive layers to provide capacitive regions between the first electrode region and the second electrode region,
   wherein the first and second conductive layers provide respectively portions of first and second conductive paths between the die and the circuit board through the interposer substrate.

2. The interposer substrate as claimed in claim 1 wherein:
   the first conductive layer has a plurality of first conductive portions electrically isolated from the first electrode region,
   the second conductive layer has a plurality of second conductive portions electrically isolated from the second electrode region,
   the dielectric layer has a plurality of first dielectric layer vias to electrically couple the first electrode region with the plurality of second conductive portions, and
   the dielectric layer has a plurality of second dielectric layer vias to electrically couple the second electrode region with the plurality of first conductive portions.

3. The interposer substrate as claimed in claim 2 wherein the first and second electrode regions form parallel plates of a capacitor to provide capacitance respectively between the first and second conductive paths.

4. The interposer substrate as claimed in claim 2 wherein the substrate layer has first thru-vias and second thru-vias, the first thru-vias to electrically couple the first electrode region with terminal pads for a first supply voltage, the second thru-vias to electrically couple the first conductive portions with terminal pads for a second supply voltage.

5. The interposer substrate as claimed in claim 4 wherein first and second conductive paths are provided between a die and a substrate for the first and second supply voltages respectively, the first conductive path comprising the first thru-vias, the first electrode region, first dielectric layer vias and second conductive portions, the second conductive path comprising the second thru-vias, and first conductive portions, the second dielectric layer vias and the second electrode region.

6. The interposer substrate as claimed in claim 5 further comprising a plurality of conductive input/output (I/O) vias to provide I/O signal paths between the die and the substrate, the I/O vias extending through the substrate layer, the first conductive layer, the dielectric layer and the second conductive layer.

7. The interposer substrate as claimed in claim 6 wherein the second conductive layer further comprises a plurality of I/O rerouting traces for re-routing at least some of the I/O signal paths to positions on the substrate that differ from positions on the die.

8. The interposer substrate as claimed in claim 4 wherein the substrate layer is a silicon substrate layer having a thickness between 200 and 500 microns.

9. The interposer substrate as claimed in claim 8 wherein the first and second thru-vias of the silicon substrate layer are made using an atmospheric downstream plasma process.

10. The interposer substrate as claimed in claim 1 wherein the dielectric layer is between 400 and 600 Angstroms in thickness.

11. The interposer substrate as claimed in claim 1 wherein the dielectric layer is selected from a group consisting of Tantalum Petna Oxide ($Ta_2O_5$), oxynitride film (SiONx film), Barium Titanate ($Sr/BaTiO_3$) and Barium Strontium Titanate (BST).

12. The interposer substrate as claimed in claim 4 wherein at least a portion of the first and second thru-vias reside substantially in a grid-like pattern that alternates between the first thru-vias and the second thru-vias.

13. The interposer substrate as claimed in claim 4 further comprising:
   a third conductive layer, a portion thereof forming a third electrode region; and
   a second dielectric layer disposed between the third conductive layer and the second conductive layer, wherein second capacitive regions are formed between the third electrode region and the second electrode region.

14. The interposer substrate as claimed in claim 13 wherein:
   the third conductive layer has a plurality of third conductive portions electrically isolated from the third electrode region;
   the second dielectric layer has a plurality of third dielectric layer vias to electrically couple the third electrode region with the second conductive portions;
   the second dielectric layer has a plurality of fourth dielectric layer vias to electrically couple the third conductive regions with the second electrode region; and
   the first, second and third electrode regions to provide plates of a multi-layered capacitor.

15. A capacitor having conductive paths therethrough and providing capacitance between at least two of the conductive paths, the capacitor comprising:
   a substrate layer;
   a first conductive layer deposited on the substrate layer, a portion of the first conductive layer providing a first electrode region;
   a second conductive layer, a portion of the second conductive layer forming a second electrode region; and
   a dielectric layer disposed between the first and second conductive layers wherein capacitive regions are formed between the first electrode region and the second electrode region,
   wherein the at least two conductive paths are provided through the substrate layer to provide conductive paths between opposite sides of the capacitor.

16. The capacitor of claim 15 wherein the two conductive paths are electrically isolated, wherein a first of the opposite sides including the substrate layer, a second of the opposite sides including the second conductive layer.

17. A capacitor having conductive paths therethrough and providing capacitance between at least two of the conductive paths, the capacitor comprising:

a substrate layer;

a first conductive layer deposited on the substrate layer, a portion of the first conductive layer providing a first electrode region;

a second conductive layer, a portion of the second conductive layer forming a second electrode region; and a dielectric layer disposed between the first and second conductive layers wherein capacitive regions are formed between the first electrode region and the second electrode region, wherein:

the first conductive layer has a plurality of first conductive portions electrically isolated from the first electrode region;

the second conductive layer has a plurality of second conductive portions electrically isolated from the second electrode region;

the dielectric layer has a plurality of first dielectric layer vias to electrically couple the first electrode region with the plurality of second conductive portions; and the dielectric layer has a plurality of second dielectric layer vias to electrically couple the second electrode region with the plurality of first conductive portions.

18. The capacitor as claimed in claim 15 wherein the substrate layer has first thru-vias and second thru-vias, wherein a first conductive path comprises the first thru-vias, the first electrode region, the first dielectric layer vias and the second conductive portions, and wherein a second conductive path comprises the second thru-vias, the first conductive portions, the second dielectric layer vias and the second electrode region.

19. A multilayer capacitor having conductive paths therethrough and providing capacitance between at least two of the conductive paths, the multilayer capacitor comprising:

a substrate layer;

a first conductive layer disposed over the substrate layer, a portion of the first conductive layer providing a first electrode region;

a second conductive layer, a portion of the second conductive layer forming a second electrode region;

a first dielectric layer disposed between the first and second conductive layers wherein first capacitive regions are formed between the first electrode region and the second electrode region;

a third conductive layer, a portion of the third conductive layer forming a third electrode region; and a second dielectric layer disposed between the second and third conductive layers, wherein second capacitive regions are formed between the second electrode region and third electrode region.

20. The multilayer capacitor as claimed in claim 18 wherein:

the first conductive layer has a plurality of first conductive portions electrically isolated from the first electrode region;

the second conductive layer has a plurality of second conductive portions electrically isolated from the second electrode region;

the third conductive layer has a plurality of third conductive portions electrically isolated from the third electrode region;

the first dielectric layer has a plurality of first dielectric layer vias to electrically couple the first electrode region with the plurality of second conductive portions;

the first dielectric layer has a plurality of second dielectric layer vias to electrically couple the second electrode region with the plurality of first conductive portions;

the second dielectric layer has a plurality of third dielectric layer vias to electrically couple the third electrode region with the second conductive portions;

the second dielectric layer has a plurality of fourth dielectric layer vias to electrically couple the third conductive regions with the second electrode region; and the first, second and third electrode regions to provide plates of a multi-layered capacitor.

21. The multilayer capacitor as claimed in claim 20 wherein the substrate layer has first thru-vias and second thru-vias, and wherein a first of the conductive paths comprises the first thru-vias, the first electrode region, the first dielectric layer vias, the second conductive portions, the third dielectric layer vias and the third electrode region, and wherein a second of the conductive paths comprises the second thru-vias, and first conductive portions, the second dielectric layer vias, the second electrode region, the fourth dielectric layer vias and third conductive portions.

* * * * *